(12) United States Patent
Fu et al.

(10) Patent No.: US 8,514,561 B2
(45) Date of Patent: Aug. 20, 2013

(54) LOCKING MECHANISM AND INFORMATION HANDLING SYSTEM USING THE SAME

(75) Inventors: Jia-Qi Fu, Shenzhen (CN); Wei Qiu, Shenzhen (CN); Hai-Chen Zhou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 403 days.

(21) Appl. No.: 12/978,620

(22) Filed: Dec. 26, 2010

(65) Prior Publication Data

US 2012/0140398 A1  Jun. 7, 2012

(51) Int. Cl.
*G06F 1/16* (2006.01)
(52) U.S. Cl.
USPC .............................. 361/679.31; 361/679.37
(58) Field of Classification Search
USPC ................................................... 361/679.31
See application file for complete search history.

(56) References Cited

U.S. PATENT DOCUMENTS

| | | | | |
|---|---|---|---|---|
| 5,652,695 A | * | 7/1997 | Schmitt | 361/679.31 |
| 5,995,365 A | * | 11/1999 | Broder et al. | 361/679.31 |
| 6,084,768 A | * | 7/2000 | Bolognia | 361/679.31 |
| 6,272,011 B1 | * | 8/2001 | Chen | 361/679.31 |
| 8,297,574 B2 | * | 10/2012 | Zhang et al. | 361/679.31 |
| 2002/0141153 A1 | * | 10/2002 | Su | 361/687 |

FOREIGN PATENT DOCUMENTS

JP    2010-114006 A    5/2010

* cited by examiner

*Primary Examiner* — Lisa Lea Edmonds
(74) *Attorney, Agent, or Firm* — Altis Law Group, Inc.

(57) ABSTRACT

A data storage device is inserted in an information handling apparatus, and is prevented from being accidently disconnecting from the information handling apparatus by an locking mechanism. The locking mechanism includes a frame receiving the data storage device, and a retainer mounted to the frame, and comprising two resilient arms extending out of the frame to be correspondingly secured in two retaining holes defined in the information handling apparatus.

9 Claims, 3 Drawing Sheets

LOCKING MECHANISM AND INFORMATION HANDLING SYSTEM USING THE SAME

BACKGROUND

1. Technical Field

The present disclosure relates to locking mechanism, and particularly to an locking mechanism for preventing a data storage device from being accidently disconnected form an information handling apparatus.

2. Description of Related Art

A data storage device, such as a universal serial bus disk, is often inserted into a peripheral port of an information handling apparatus, such as a server, for data transmission. However, there may be a risk of accidently disengaging the data storage device from the information handling apparatus, thereby disrupting the data transmission.

BRIEF DESCRIPTION OF THE DRAWINGS

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
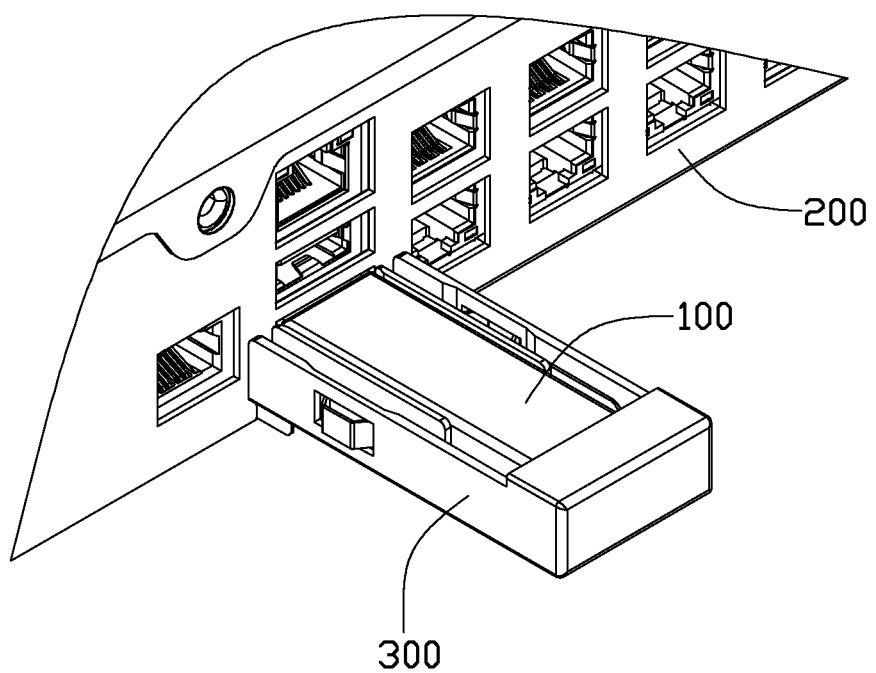
FIG. 1 is an assembled, isometric view of an exemplary embodiment of an information handling system, which includes an information handling apparatus, a data storage device, and an locking mechanism.

Referring to FIG. 1, an exemplary embodiment of an information handling system includes an information handling apparatus 200, a data storage device 100 inserted into the apparatus 200, and a locking mechanism 300 receiving the data storage device 100 and connected to the apparatus 200.

Figure 2:
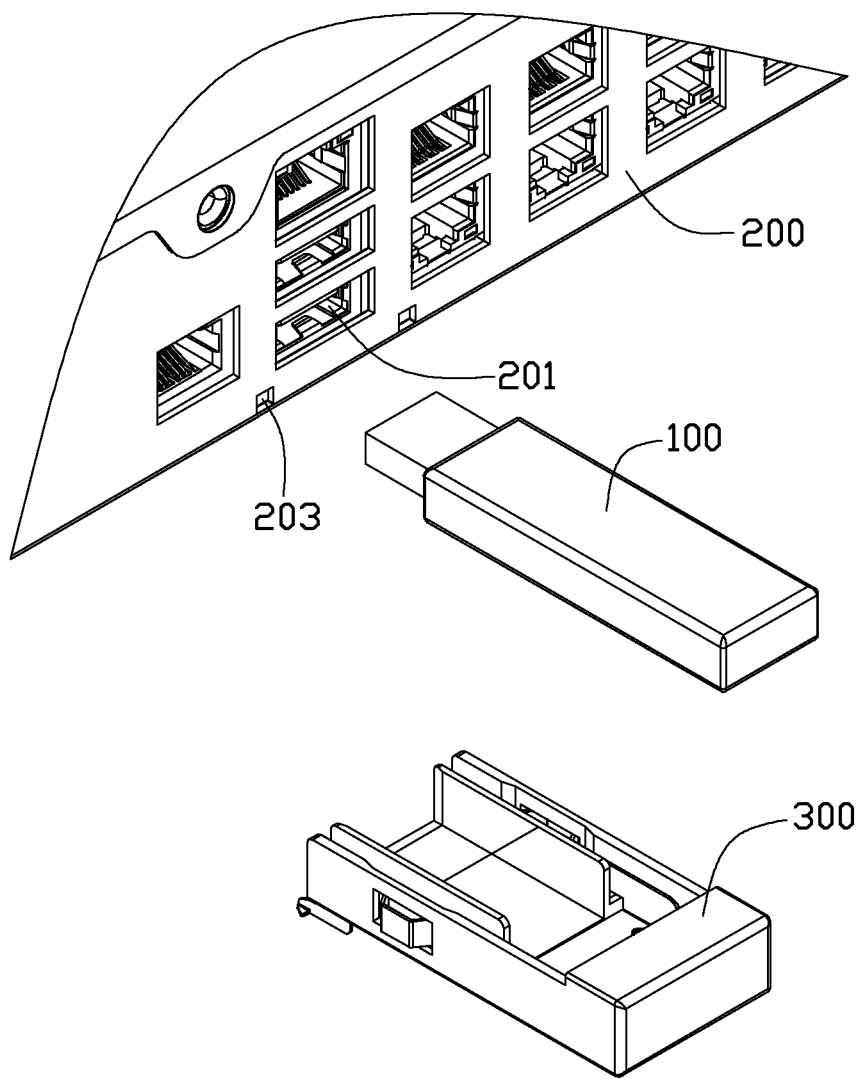
FIG. 2 is an exploded, isometric view of FIG. 1.

Referring to FIG. 2, in one embodiment, the data storage device 100 is a universal serial bus disk. The apparatus 200 defines a peripheral port 201, and two retaining holes 203 arranged at opposite sides of the peripheral port 201.

Figure 3:
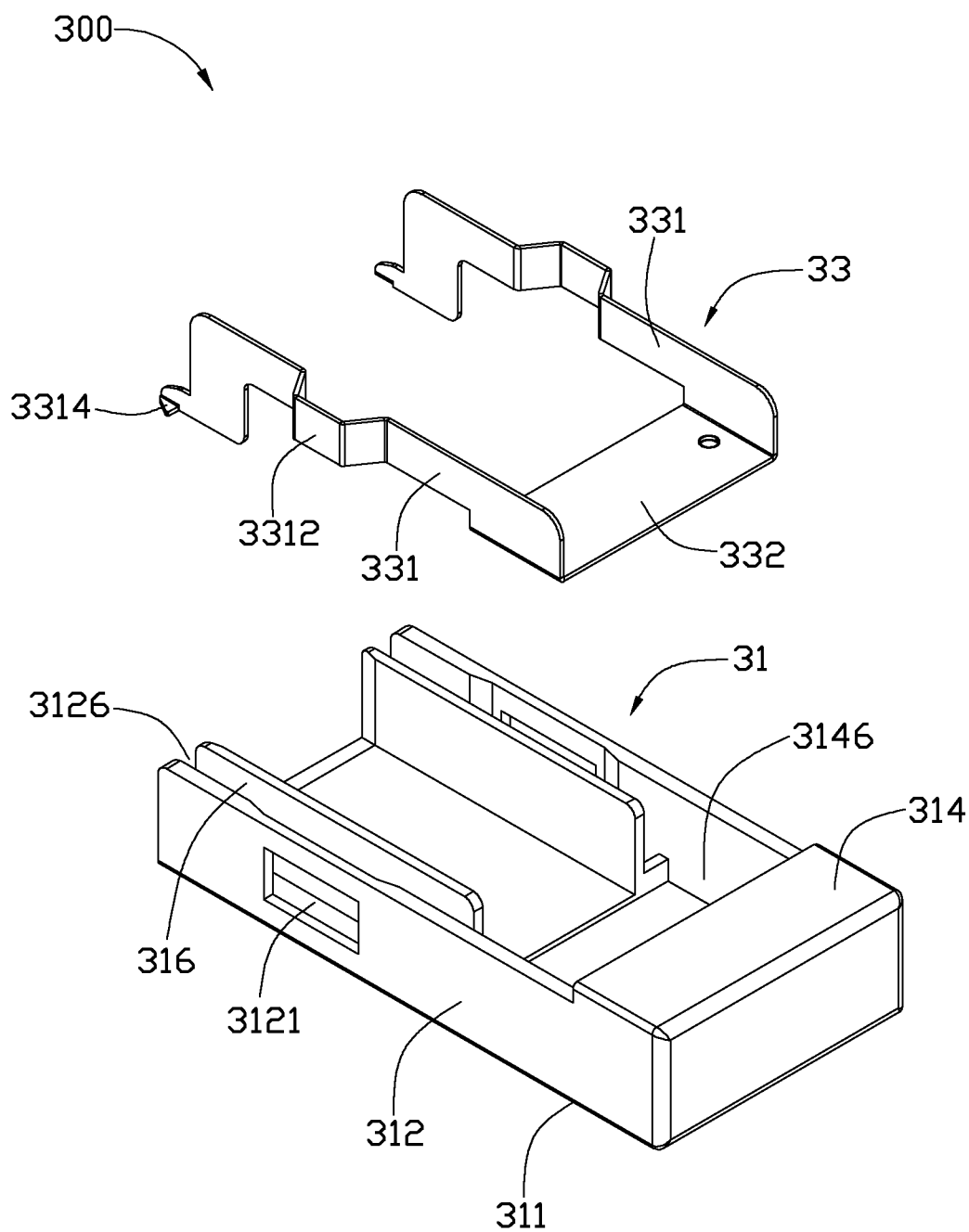
FIG. 3 is an exploded, isometric view of the locking mechanism of FIG. 1.

Referring to FIG. 3, the locking mechanism 300 includes a substantially rectangular frame 31 with a top and a front side of the frame 31 open, and a resilient retainer 33. The top side of the frame 31 provides access for mounting the retainer 33.

The frame 31 includes a bottom wall 311, two sidewalls 312 respectively perpendicularly extending up from opposite sides of the bottom wall 311, and a block 314 positioned at a rear end of the bottom wall 311 between the sidewalls 312. Each of the sidewalls 312 defines a notch 3121. Two positioning plates 316 extend up from the bottom wall 311, and are respectively near the sidewalls 312 to bound two locating slots 3126 between the positioning plates 316 and the corresponding sidewall 312. A mounting space 3146 is defined between rear ends of positioning plates 316 and the block 314.

The retainer 33 is a substantially U-shaped spring piece, and comprises two resilient arms 331 and a mounting portion 332 connected between rear ends of the resilient arms 331. Each of the resilient arms 331 includes a manipulating portion 3312 protruding out from the resilient arm 331, away from the other resilient arm 331. A retaining tab 3314 is formed at an outer surface of a front end of each of the resilient arms 331.

In assembly, the retainer 33 is mounted to the frame 31, with the mounting portion 332 of the retainer 33 positioned in the mounting space 3146 of the frame 31, and the resilient arms 331 of the retainer 33 respectively received the locating slots 3126 of the frame 31. The resilient arms 331 respectively resist against inner sides of the sidewalls 312 of the frame 31. The manipulating portions 3312 of the resilient arms 331 protrude out of the frame 31, through the notches 3121 of the corresponding sidewalls 312 of the frame 31. The resilient arms 331 of the retainer 33 extend forwards to make the retaining tabs 3314 in front of the frame 31.

Referring to FIG. 1 again, in use, the data storage device 100 is inserted into the peripheral port 201 of the apparatus 200 to be electrically coupled to the apparatus 200. The front end of the frame 31 is manipulated to align the frame 31 with a rear end of the data storage device 100, and then the frame 31 is inserted into the frame 21 between the positioning slots 316. At the same time, the retaining tabs 3314 of the resilient arms 331 of the retainer 33 are aligned with the corresponding retaining holes 203 of the apparatus 200. The frame 31 is further slid forward until the block 314 of the frame 31 abuts against the rear end of the data storage device 100, and thereby the retaining tabs 3314 are engaged in the corresponding retaining holes 203 of the apparatus 200 to secure the locking mechanism 300 to the apparatus 200. Therefore, the data storage device 100 is prevented from being accidentally disconnected from the apparatus 200.

To detach the data storage device 100 from the apparatus 200, the manipulating portions 3312 of the retainer 31 are pressed to deform the resilient arms 331 and make the retaining tabs 3314 disengage from the retaining holes 203 of the apparatus 200. Then the frame 31 can be slid rearwards away from the apparatus 200 to disengage from the data storage device 100. After disengagement of the frame 31 from the data storage device 100, the data storage 100 can be drawn out of the peripheral port 201 of the apparatus 200.

It is to be understood, however, that even though numerous characteristics and advantages of the embodiment have been set forth in the foregoing description, together with details of the structure and function of the embodiment, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A locking mechanism to prevent a data storage device from disengaging from a peripheral port of an information handling apparatus, the locking mechanism comprising:
    a frame to receive the data storage device; and
    a retainer retained to the frame and to be detachably secured to the information handling apparatus;
    wherein the frame comprises a block abutting against a rear end of the data storage device opposite to the information handling apparatus, to prevent the data storage device from moving rearwards away from the information handling apparatus; and wherein the retainer comprises two resilient arms extending out of a front end of the frame away from the block, a retaining tab is formed at a front end of each of the resilient arms to engage in the information handling apparatus adjacent to the peripheral port.

2. The locking mechanism of claim 1, wherein the frame further comprises a bottom wall, two sidewalls respectively perpendicularly extending up from opposite sides of the bottom wall, and two positioning plates extending up from the bottom wall, respectively closed to the sidewalls to bound two locating slots between the positioning plates and the corresponding sidewalls, the resilient arms of the retainer are respectively detachably received in the locating slots.

3. The locking mechanism of claim 2, wherein each of the sidewalls of the frame defines a notch, each of the resilient arm forms a manipulating portion protruding out of the frame through the notch of the corresponding sidewall of the frame to detach the resilient arm.

4. The locking mechanism of claim 2, wherein the retainer further comprises a mounting portion connected between rear ends of the resilient arms, a mounting space is defined in the frame between rear ends of the positioning plates and the block, to receive the mounting portion of the retainer.

5. The locking mechanism of claim 1, wherein the frame is substantially U-shaped with a top side of the frame being opened to provide an access for mounting the retainer.

6. An information handling system comprising:

an information handling apparatus comprising a peripheral port;

a data storage device comprising a front end inserted into the peripheral port to be electrically connected to the information handling apparatus; and an locking mechanism comprising a frame receiving the data storage device, and a retainer retained to the frame and detachably secured to the information handling system;

wherein the information handling apparatus defines a retaining hole adjacent to the peripheral port, the retainer comprises a resilient arm extending out of a front end of the frame to be detachably engaged in the retaining hole of the information handling apparatus.

7. The information handling system of claim 6, wherein a front end of the frame is opened to provide an access for the data storage device sliding in or out of the frame.

8. The information handling system of claim 6, wherein the data storage device is a universal serial bus disk.

9. The information handling system of claim 6, wherein the frame comprises a block abutting against a rear end of the data storage device opposite to the information handling apparatus.

* * * * *